US008342652B2

(12) United States Patent
Nystrom et al.

(10) Patent No.: US 8,342,652 B2
(45) Date of Patent: Jan. 1, 2013

(54) MOLDED NOZZLE PLATE WITH ALIGNMENT FEATURES FOR SIMPLIFIED ASSEMBLY

(75) Inventors: Peter J. Nystrom, Webster, NY (US); Scott Phillips, West Henrietta, NY (US); Mark Cellura, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 239 days.

(21) Appl. No.: 12/789,444

(22) Filed: May 27, 2010

(65) Prior Publication Data

US 2011/0292126 A1 Dec. 1, 2011

(51) Int. Cl.
*B41J 2/14* (2006.01)
*B41J 2/16* (2006.01)
*H05K 3/00* (2006.01)

(52) U.S. Cl. .......................................... 347/47; 29/829

(58) Field of Classification Search .................... 347/47
See application file for complete search history.

(56) References Cited

U.S. PATENT DOCUMENTS 4,712,172 A * 12/1987 Kiyohara et al. ............... 347/60
5,574,488 A * 11/1996 Tamura ........................... 347/63
2006/0017766 A1 * 1/2006 Ito .................................. 347/20

* cited by examiner

*Primary Examiner* — Matthew Luu
*Assistant Examiner* — Lisa M Solomon
(74) *Attorney, Agent, or Firm* — MH2 Technology Law Group

(57) ABSTRACT

An ink jet print head includes a molded nozzle plate, the molded nozzle plate further including molded die alignment features. The molded die alignment features can be registered to the apertures of the print head die.

9 Claims, 7 Drawing Sheets

MOLDED NOZZLE PLATE WITH ALIGNMENT FEATURES FOR SIMPLIFIED ASSEMBLY

DESCRIPTION OF THE INVENTION

1. Field of the Invention

This invention relates generally to imaging and, more particularly, to a molded nozzle plate with alignment features for simplified assembly.

2. Background of the Invention

In known micro-electromechanical ink jet (MEMSJet) print head technology, alignment between ink outlets of the MEMS die and nozzle holes of a nozzle plate can be difficult due in part to the method of assembly of the ink jet print head. In particular, the current design for the MEMS device is built by starting with the substrate and building up from the substrate. This allows for potential error in the assembly process by the difficulty in accurately aligning critical features of the ink outlets and the nozzle holes. Because the ink inlets are in the substrate and the substrate is hidden by the MEMS die in assembly, the tolerance within this stackup can be appreciable. The known design is also disadvantaged because a maintenance wiper system is the preferred way to remove debris from the head face around the nozzles holes, and the outer surface of the nozzle plate is typically not a smooth enough surface to reliably use a wiper system. Rubber wipers quickly deteriorate when scraping over an edge or step.

It would, therefore, be desirable to provide a molded nozzle plate with alignment features for simplified assembly of an ink jet print head.

SUMMARY OF THE INVENTION

According to various embodiments, the present teachings include an ink jet print head. The ink jet print head includes a molded nozzle plate, the molded nozzle plate comprising a nozzle hole face having a plurality of nozzle holes therein, side walls surrounding the nozzle hole face to define a cavity, and a molded die alignment feature in the cavity of the nozzle plate; and a MEMS die positioned within the cavity according to the die alignment feature.

According to various embodiments, the present teachings include a nozzle plate for an ink jet print head. The nozzle plate includes a face plate having an inner surface, an outer surface, and plural nozzle holes; side walls integrally molded with and surrounding the face plate on a side of the inner surface, the side walls defining a cavity on a side of the inner surface; and a die alignment feature integrally molded in the cavity of the nozzle plate.

According to various embodiments, the present teachings include a method of forming an ink jet print head. The method includes injection molding a nozzle plate, the nozzle plate comprising a nozzle face plate having nozzle holes formed therein, side walls surrounding the nozzle face plate to define a cavity on an inner side of the nozzle face plate, alignment features projecting from the side walls into the cavity, and ink channel walls projecting from the inner side of the nozzle face plate; flip chip bonding a driver die to a flexible circuit; attaching the flexible circuit to a MEMS die; bonding the driver die and MEMS die to the inner surface of the nozzle face plate, according to the alignment features; and covering the cavity with a backing plate.

Additional advantages of the invention will be set forth in part in the description which follows, and in part will be learned by practice of the invention. The advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

It should be noted that some details of the figures have been simplified and are drawn to facilitate understanding of the embodiments rather than to maintain strict structural accuracy, detail, and scale.

DESCRIPTION OF THE EMBODIMENTS

Reference will now be made in detail to the present embodiments (exemplary embodiments), examples of which are illustrated in the accompanying drawings. Wherever possible, the same reference numbers will be used throughout the drawings to refer to the same or like parts. In the following description, reference is made to the accompanying drawings that form a part thereof, and in which is shown, by way of illustration, specific exemplary embodiments in which the present teachings may be practiced. These embodiments are described in sufficient detail to enable those skilled in the art to practice the invention and it is to be understood that other embodiments may be utilized and that changes may be made without departing from the scope of the present teachings. The following description is, therefore, merely exemplary.

Figure 1:
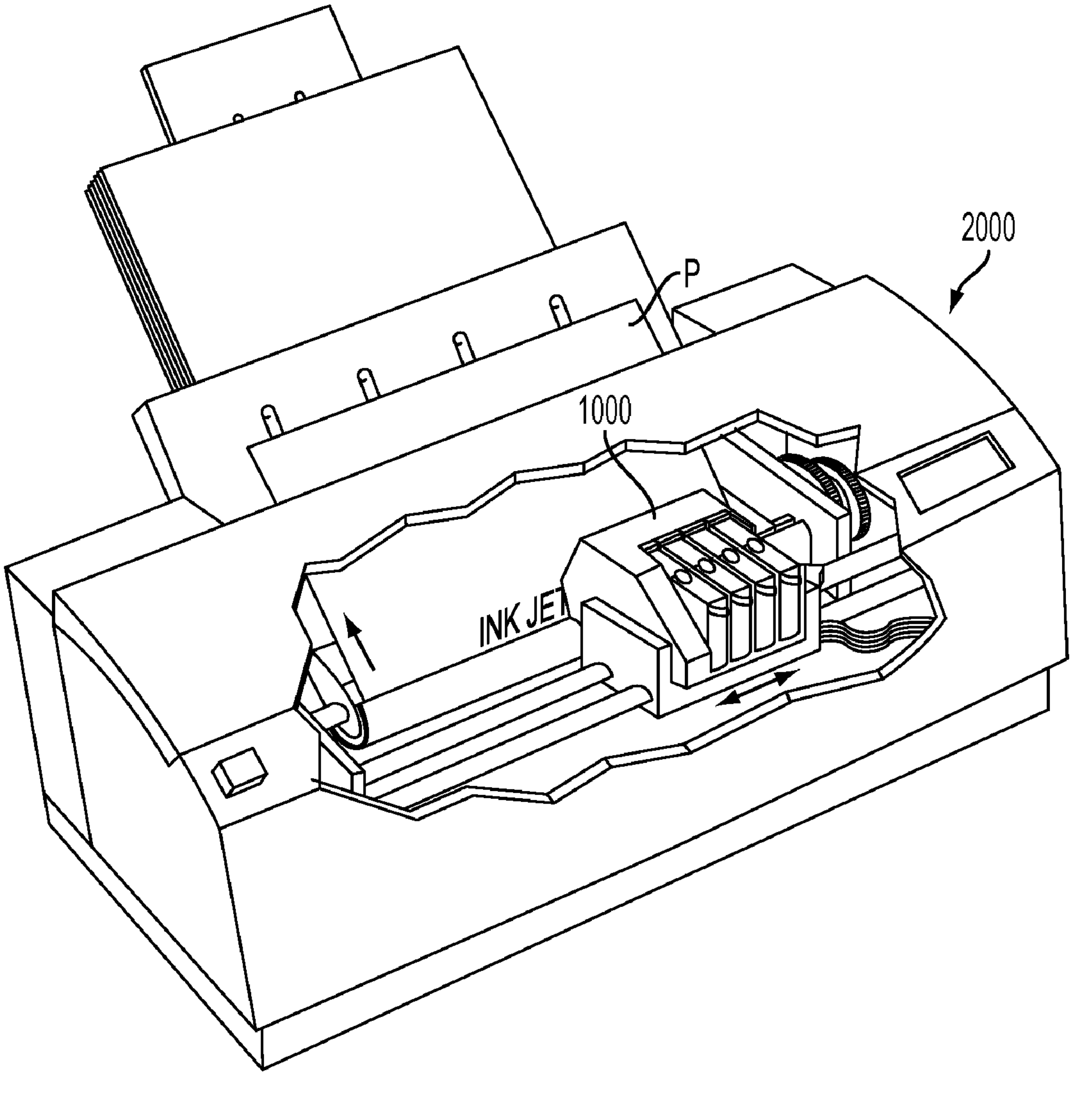
FIG. 1 is a perspective view of an ink jet print head, in accordance with the present teachings.

FIG. 1 depicts an exemplary ink jet printer 2000 in accordance with the present teachings. It should be readily apparent to one of ordinary skill in the art that the ink jet printer 2000 depicted in FIG. 1 represents a generalized schematic illustration and that other components can be added or existing components can be removed or modified.

As shown in FIG. 1, one or more fluid drop ejectors 1000 can be incorporated into the ink jet printer 2000, to eject droplets of ink onto a substrate P. The individual fluid drop ejectors 1000 can be operated in accordance with signals derived from an image source to create a desired printed image on print medium P. Printer 2000 can take the form of the illustrated reciprocating carriage printer that moves a printhead in a back and forth scanning motion, or of a fixed type in which the print substrate moves relative to the printhead.

The carriage type printer can have a printhead having a single die assembly or several die assemblies abutted together for a partial width size printhead. Because both single die and multiple-die partial width printheads function substantially the same way in a carriage type printer, only the printer with a single die printhead will be discussed. The only difference, of course, is that the partial width size printhead will print a larger swath of information. The single die printhead, containing the ink channels and nozzles, can be sealingly attached to a disposable ink supply cartridge, and the combined printhead and cartridge assembly is replaceably attached to a carriage that is reciprocated to print one swath of information at a time, while the recording medium is held stationary. Each swath of information is equal to the height of the column of nozzles in the printhead. After a swath is printed, the recording medium P is stepped a distance at most equal to the height of the printed swath, so that the next printed swath is contiguous or overlaps with the previously printed swath. This procedure is repeated until the entire image is printed.

Figure 2:
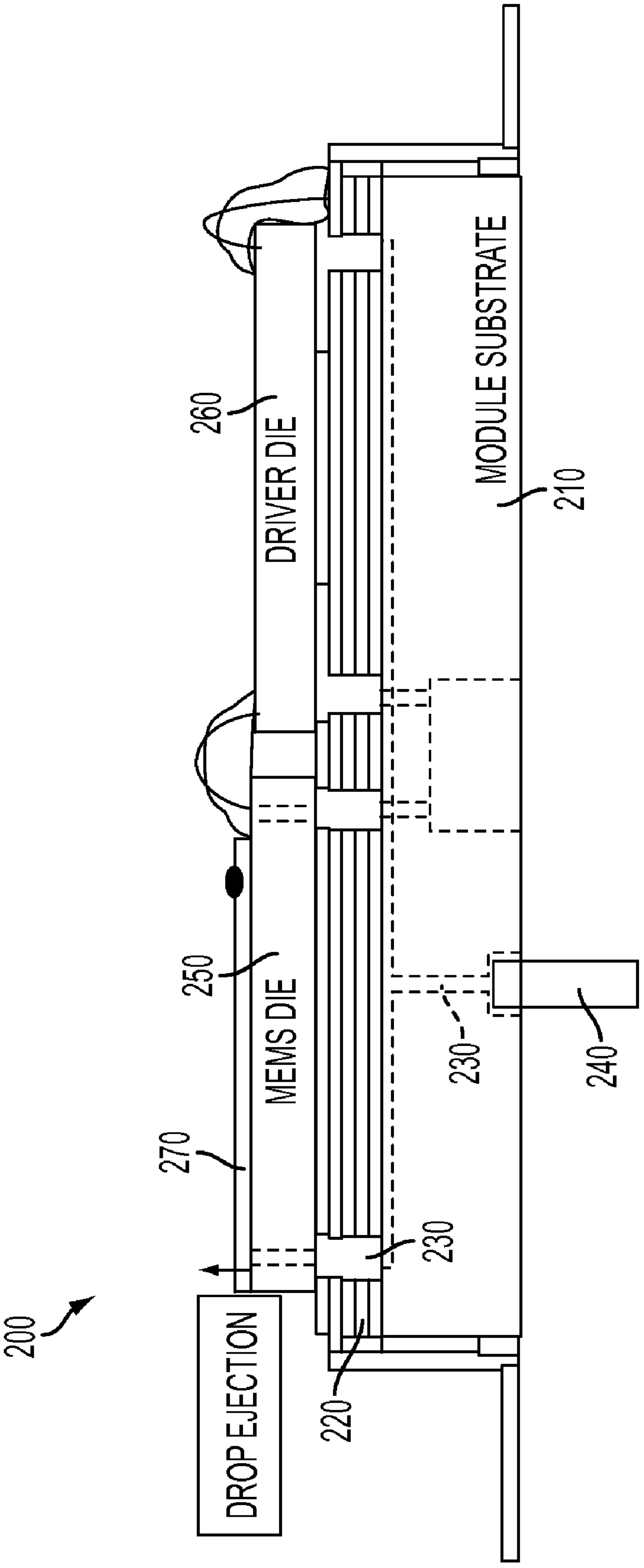
FIG. 2 PRIOR ART
FIG. 2 is a known design for an electrostatically actuated ink jet print head.

FIG. 2 depicts a known design for an electrostatically actuated ink jet print head 200. The known ink jet print head 200 includes a substrate 210, at least one silicon wafer 220 on an upper surface of the substrate 210, one or more ink passages 230 through the substrate 210 and wafers 220, a tube 240 connecting the ink passage 230 of the substrate 210 to an ink supply reservoir (not shown), a MEMS die 250 mounted on the substrate 210 and a driver die 260 mounted in parallel with the MEMS die on the substrate 210. A nozzle plate 270 is mounted on the MEMS die 250, the nozzle plate 270 being the surface from which ink drops are ejected from the print head 200. The MEMS die 250 of the print head 200 can include an electrostatically actuated membrane controlled by an electrode as known in the art.

Various other components are depicted but will not be described herein. One of ordinary skill in the art will appreciate the configuration of an existing ink jet print head 200. Typically, the ink jet print head 200 is assembled starting with the substrate and building up from there. This can cause potential error in the assembly process because of the need to align crucial features. The critical features can include, but are not limited to, alignment of nozzle outlets in the MEMS die with one or both of nozzle outlets in the substrate and/or nozzle holes in the nozzle plate of the print head 200.

Figure 3A:
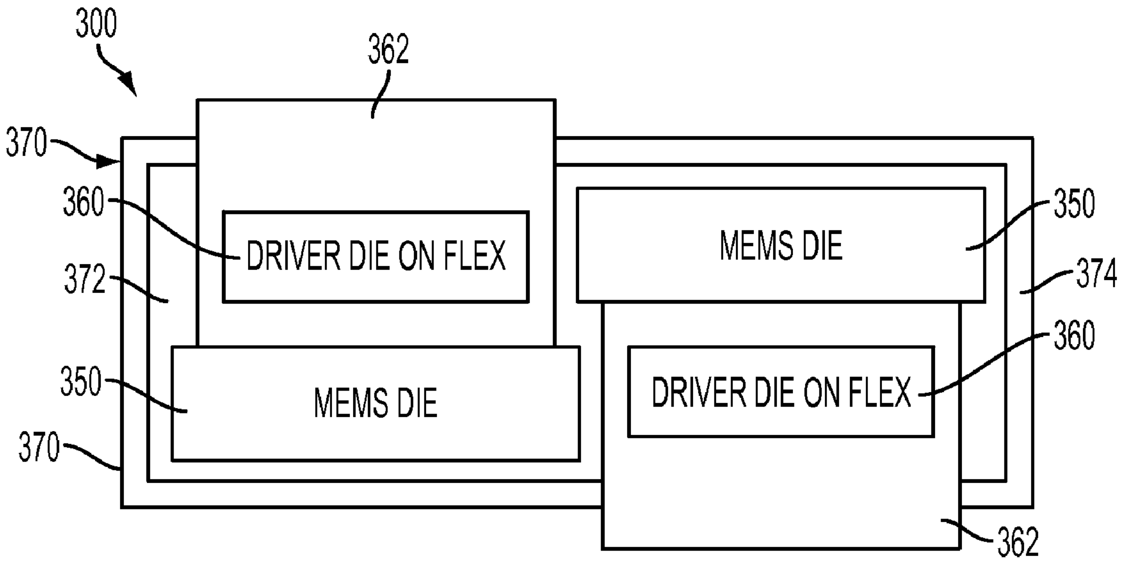
FIG. 3A is a top plan view of an exemplary print head particularly depicting an exemplary nozzle plate.
Figure 3B:
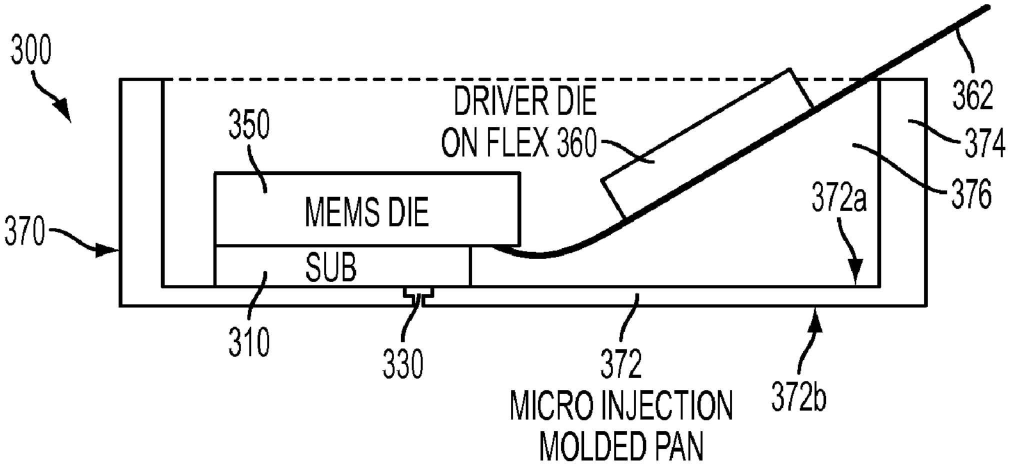
FIG. 3B is a side view of an exemplary print head particularly depicting an exemplary nozzle plate, in accordance with the present teachings.

FIG. 3A is a top plan view and FIG. 3B is a side view of an exemplary print head 300 particularly depicting an exemplary nozzle plate 310 in accordance with the present teachings. Only certain components have been depicted for clarity and ease of description. The exemplary print head 300 can be used, for example, in the ink jet printer 2000 of FIG. 1 and can include additional known components, for example, as depicted in the print head 200 of FIG. 2. It should be readily apparent to one of ordinary skill in the art that the print head 300 and nozzle plate 370 depicted in FIGS. 3A and 38 represent generalized schematic illustrations and that other components can be added or existing components can be removed or modified.

The print head 300 can include a nozzle plate 370; a two die arrangement including a MEMS die 350 and a driver die 360. The MEMS die 350 and the driver die 360 can be staggered as shown. That portion of the print head 300 depicted can also include a flexible circuit 362.

The nozzle plate 370 can include a face plate 372 having an inner surface 372*a* and an outer surface 372*b*. Side walls 374 surround the face plate 372 so as to configure a cavity 376 on a side of the inner surface 372*a* of the face plate 372. The nozzle plate 370 can be molded in order to integrally form the face plate 372 and side walls 374. Therefore, the nozzle plate 370 is of a one piece construction. The face plate 372 of the nozzle plate 370 can include nozzle holes 330. The nozzle holes 330 can be formed during a molding of the nozzle plate 370, or can be laser ablated subsequent to formation of the molded nozzle plate. In certain embodiments, a larger hole can be formed during molding of the nozzle plate, and a laser ablated film can be applied to the face plate to further define a size of the nozzle holes 330.

The MEMS die 360 can be positioned in the cavity 376 of the nozzle plate 370, and precisely aligned to the nozzle holes 330 as will be further described in connection with subsequent figures. The driver die 360 can be flip chip bonded to the flexible circuit 362. The flexible circuit 362 can be tabbed or otherwise attached to the MEMS die 350. The entire assembly can then be bonded into the cavity 376 of the injection molded nozzle plate 370. In embodiments, the assembly can be set in an epoxy to lock it in place in place in the cavity 376. With the configuration shown, deep-reactive ion etching (DRIE) ink holes can be eliminated. Instead, the ink can be routed over the back side of the MEMS die, or around the MEMS die for a cost reducing edge feed die.

Figure 4:
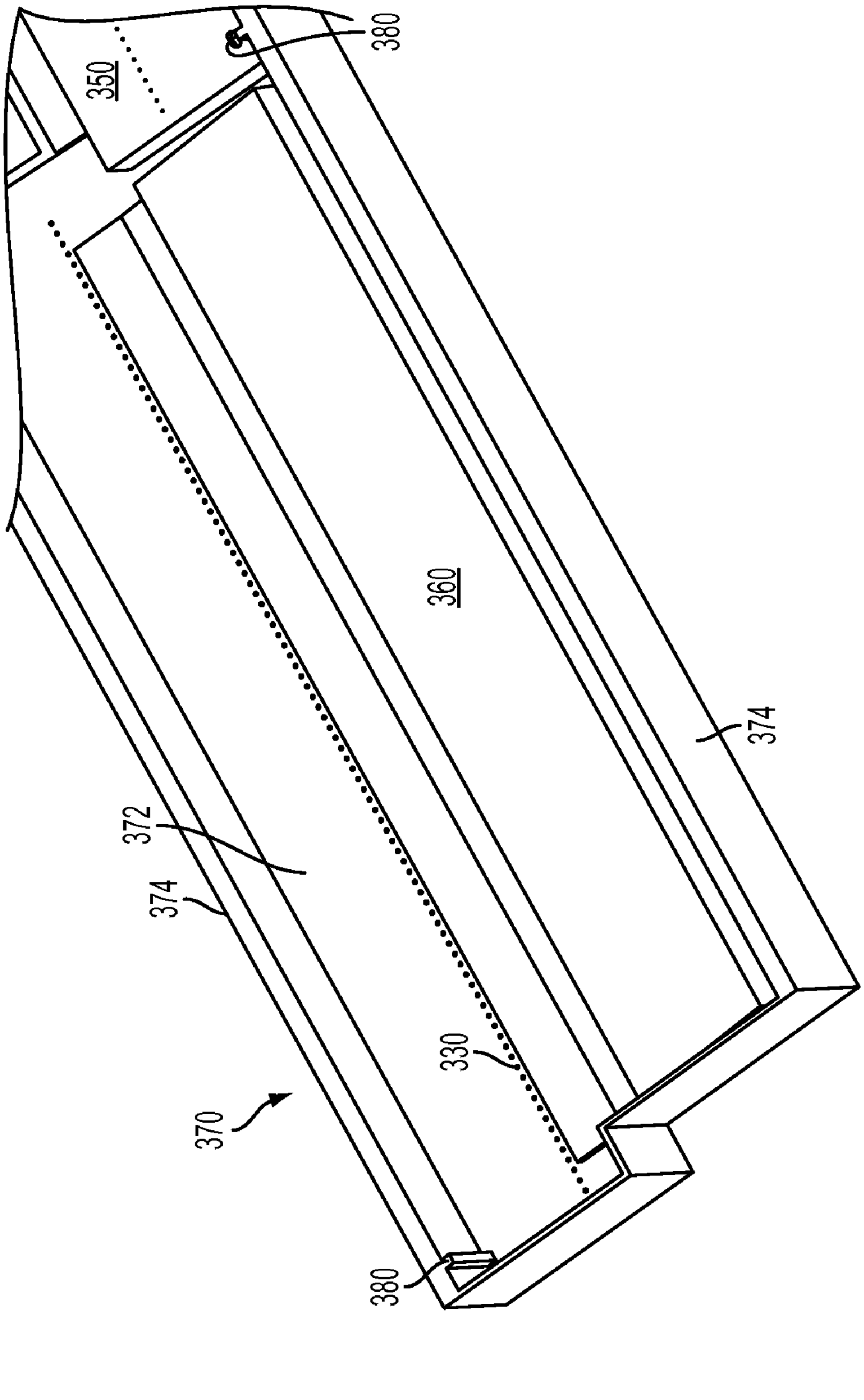
FIG. 4 is a perspective view of the exemplary molded nozzle plate, in accordance with the present teachings.

FIG. 4 is a perspective view of the exemplary molded nozzle plate 370 in accordance with the present teachings. It should be readily apparent to one of ordinary skill in the art that the molded nozzle plate 370 depicted in FIG. 4 represents a generalized schematic illustrations and that other components can be added or existing components can be removed or modified.

The molded nozzle plate 370 depicted in FIG. 4 illustrates further details including exemplary placement of nozzle holes 330 and alignment features 380. In FIG. 4, one MEMS die is removed for clarity and in order to view the alignment feature 380. A portion of a MEMS die 350 is depicted adjacent the driver die 360, the MEMS die 350. The alignment feature 380 projects into the cavity 376 by a distance suitable for engaging with and aligning a MEMS die 350 within the cavity and therefore aligning nozzle holes 330 of the nozzle plate 370 relative to corresponding ink outlets of the MEMS die 350. In embodiments, more than one alignment feature 380 can be used. In addition, alignment features can be used for aligning the driver die 360 within the cavity 376 of the nozzle plate 350. The alignment features 380 can be of a dimension to abut with outer edges of the MEMS die 350. In embodiments, the abutment between the alignment features 380 and the MEMS die 350 can be of a tolerance to secure the die as a friction fit against the alignment features 380. In addition to the tolerance between the die and the alignment features 380, an epoxy can be used to secure the MEMS die 350 in place within the cavity 376.

Figure 5:
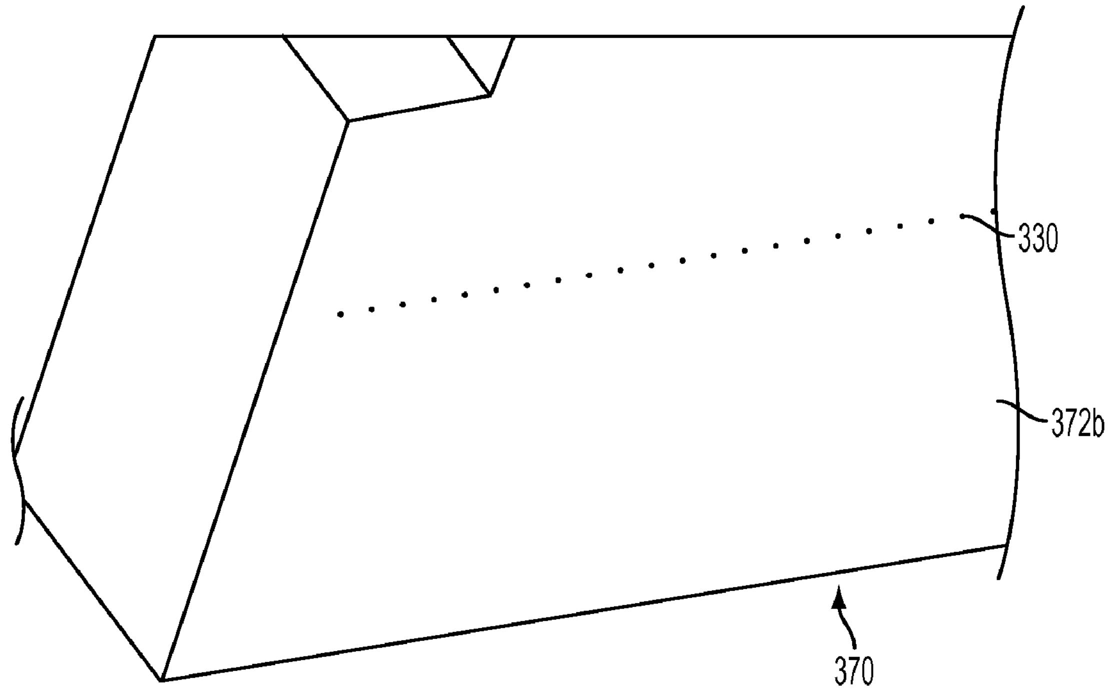
FIG. 5 is a bottom perspective view of the exemplary molded nozzle plate, in accordance with the present teachings.

FIG. 5 is a bottom perspective view of the exemplary molded nozzle plate 370 in accordance with the present teachings. It should be readily apparent to one of ordinary skill in the art that the molded nozzle plate 370 depicted in FIG. 5 represents a generalized schematic illustration and that other components can be added or existing components can be removed or modified.

As depicted in FIG. 5, the nozzle holes 330 can be positioned to have a tolerance of about 3 to about 5 microns hole center to hole center. Although not viewable from FIG. 5, it will be appreciated that the flatness of the outer surface 372*b* of the nozzle plate 370 can be within about 0.076 microns. Such a flatness, or smooth surface, enables use of wiper blades over the nozzle plate without damaging the wiper blades, and further can introduce the use of wiper blades in devices where they are currently unable to be used.

Figure 6:
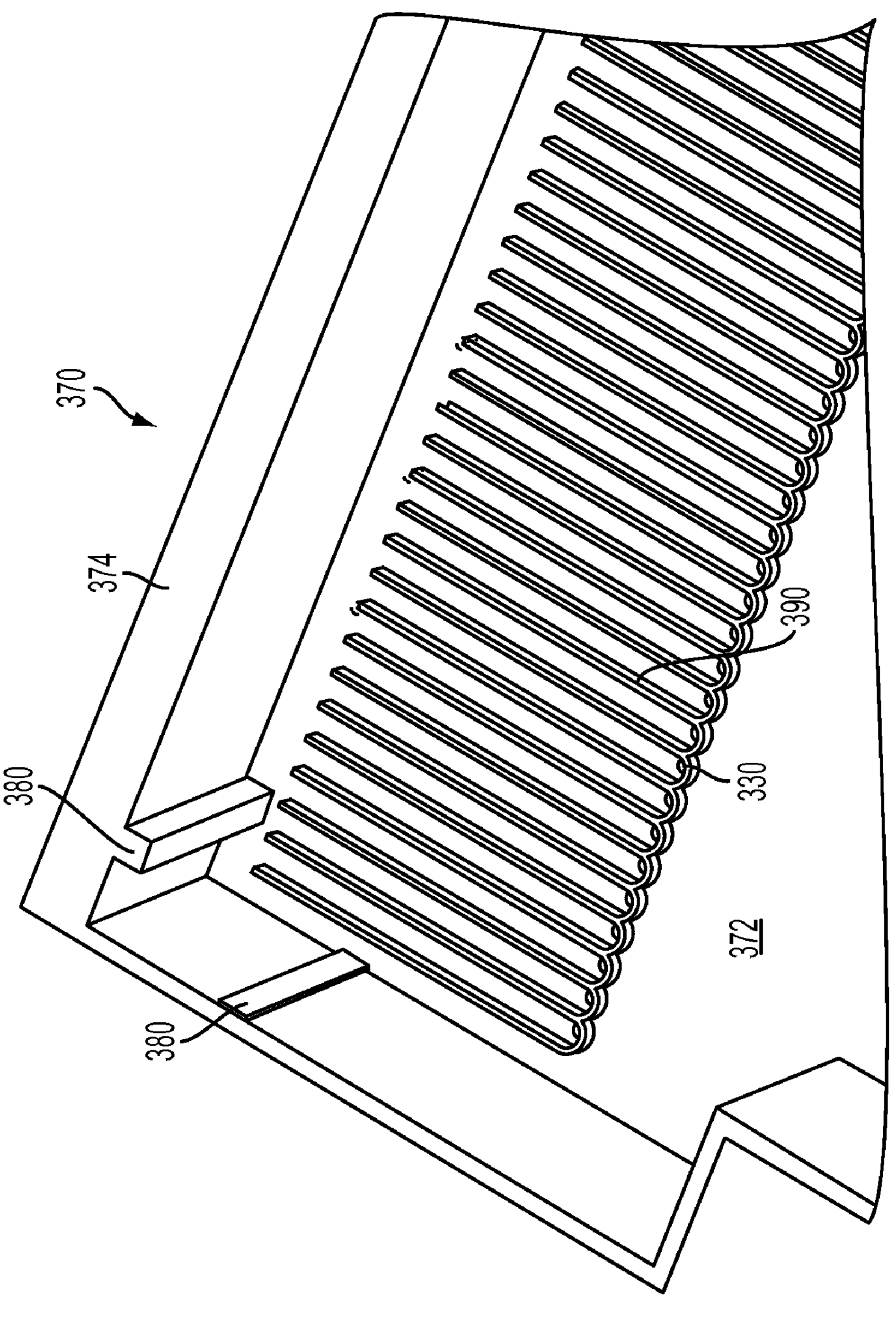
FIG. 6 is a top perspective view of a portion of the exemplary molded nozzle plate, in accordance with the present teachings.

FIG. 6 is a top perspective view of a portion of the exemplary molded nozzle plate 370 in accordance with the present teachings. It should be readily apparent to one of ordinary skill in the art that the molded nozzle plate depicted in FIG. 6 represents a generalized schematic illustration and that other components can be added or existing components can be removed or modified.

As depicted in FIG. 6, the nozzle plate 370 can include molded channel walls 390 on the inner surface 372*a*. The channel walls 390 can be configured to surround each of the nozzle holes 330, while aligning with an ink supply from the MEMS driver 350 as known. FIG. 6 also depicts alignment features 380 in further detail. The alignment features 380 can be positioned adjacent a corner of the cavity 376. The alignment features 380 can further be positioned to project from side walls 374 as ribs at locations most suitable to receive and align the MEMS die 350. The alignment features 380 can project from the side wall by a distance suitable for engaging with an edge of the MEMS die 350. It will be appreciated that the alignment features 350 do not have to be identical, but can be sized differently according to their position in the cavity 376. The channel walls 390 and the alignment features 380 can be molded at the same time as the nozzle plate 370. This molded nozzle plate 370 can therefore include the module alignment features and the ink ejection apertures in one manufacturing process, thereby rendering a nozzle plate which can eliminate tolerance stackup between the MEMS die and the nozzle holes 330 of the nozzle face 372. The channel walls 390, currently made in SU-8, can also be generated at the time of molding the nozzle plate 370, thereby further reducing cost. The molded die alignment features 380 registered to the nozzle holes 330 can allow for precise positioning of the MEMS die 350, thereby reducing tolerance variation from operator assembly error.

Figure 7:
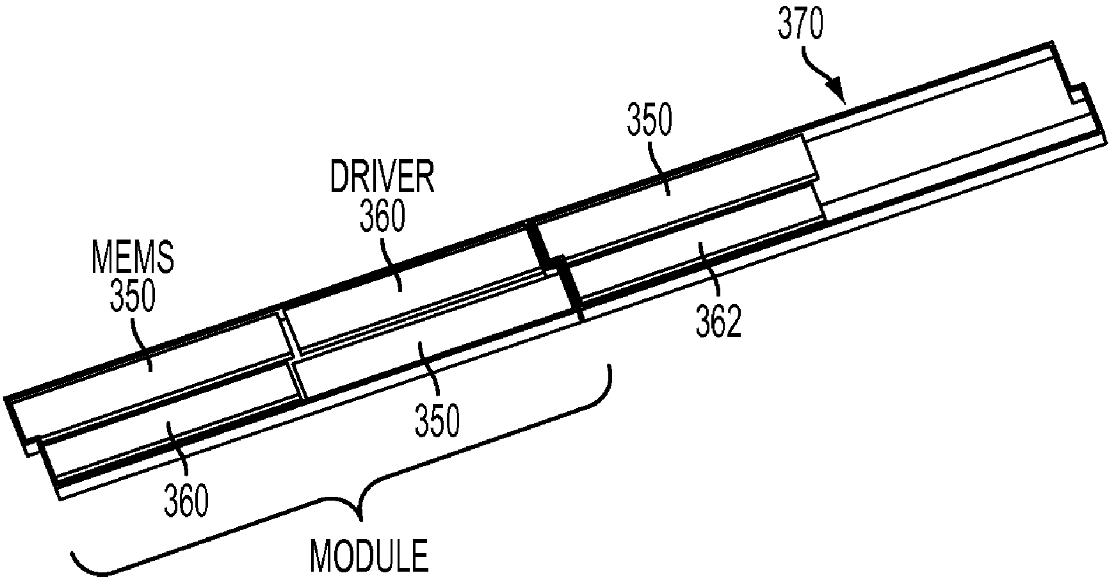
FIG. 7 is a perspective view of the exemplary molded nozzle plate, in accordance with the present teachings.

FIG. 7 is a top perspective view of the exemplary molded nozzle plate 370 in accordance with the present teachings. It should be readily apparent to one of ordinary skill in the art that the molded nozzle plate depicted in FIG. 7 represents a generalized schematic illustration and that other components can be added or existing components can be removed or modified.

As depicted in FIG. 7, a "module" of an ink jet print head can include a pair of MEMS die 350 and a pair of driver dies 360 as shown. FIG. 7 also depicts the location of the flexible circuit 362 within the nozzle plate 370.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume values as defined earlier plus negative values, e.g. −1, −1.2, −1.89, −2, −2.5, −3, −10, −20, −30, etc.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An ink jet print head comprising:

a molded nozzle plate, the molded nozzle plate comprising a nozzle hole face having a plurality of nozzle holes therein, side walls surrounding the nozzle hole face to define a cavity, and a molded die alignment feature in the cavity of the nozzle plate, wherein the molded die alignment feature comprises at least one rib projecting into the cavity and extending parallel to at least one of the sidewalls; and a MEMS die positioned within the cavity according to the die alignment feature.

2. The ink jet print head of claim 1, further comprising molded ink channel walls on an inner surface of the nozzle hole face, the molded channel walls configured to at least partially surround each of the plurality of nozzle holes.

3. The ink jet print head of claim 1, wherein the molded nozzle plate and molded die alignment feature are integrally formed.

4. The ink jet print head of claim 1, wherein the molded nozzle plate and molded die alignment feature are of a one-piece construction.

5. The ink jet print head of claim 1, wherein the die alignment feature comprises a pair of die alignment features.

6. The ink jet print head of claim 1, wherein the at least one rib of the die alignment feature is configured to abut the MEMS die so as to precisely align the MEMS die with the nozzle holes of the nozzle plate.

7. The ink jet print head of claim 1, further comprising a driver die positioned within the cavity.

8. The ink jet print head of claim 1, wherein the outer surface of the nozzle face plate comprises a substantially smooth surface.

9. The ink jet print head of claim 1, wherein the molded ink channel walls comprise pairs of at least partially parallel walls, with each pair of at least partially parallel walls coupled together via a curved wall.

* * * * *